United States Patent [19]

Tominaga et al.

[11] 4,314,225

[45] Feb. 2, 1982

[54] PRESSURE SENSOR HAVING SEMICONDUCTOR DIAPHRAGM

[75] Inventors: Tamotsu Tominaga; Teruyoshi Mihara, both of Yokohama, Japan

[73] Assignee: Nissan Motor Company, Ltd., Yokohama, Japan

[21] Appl. No.: 55,755

[22] Filed: Jul. 9, 1979

[30] Foreign Application Priority Data

Aug. 10, 1978 [JP] Japan ................. 53-96722

[51] Int. Cl.³ ............................................. G01L 1/22
[52] U.S. Cl. .......................................... 338/4; 338/42;
   73/721; 73/727; 73/754; 228/263 A; 357/26
[58] Field of Search ................. 338/2, 4, 42; 73/719,
   73/720, 721, 727, 754, 777; 228/263 A, 122,
   124; 29/610 SG; 357/26; 310/313 R, 338;
   361/417

[56] References Cited

U.S. PATENT DOCUMENTS

| | | | |
|---|---|---|---|
| 3,006,069 | 10/1961 | Rhoads et al. ................. | 228/124 |
| 3,513,430 | 5/1970 | Heller ........................... | 338/4 |
| 3,697,917 | 10/1972 | Orth et al. ...................... | 338/2 |
| 3,918,922 | 11/1975 | Anderson ................. | 228/263 A X |
| 4,016,644 | 4/1977 | Kurtz ............................. | 338/2 X |
| 4,019,388 | 4/1977 | Hall et al. ..................... | 73/754 |
| 4,040,297 | 8/1977 | Karsmakers et al. ......... | 338/4 X |
| 4,078,711 | 3/1978 | Bell et al. ................ | 228/263 A X |
| 4,102,210 | 7/1978 | Couston et al. ................ | 73/727 |
| 4,121,334 | 10/1978 | Wallis .................... | 29/610 SG X |
| 4,127,840 | 11/1978 | House ........................... | 338/42 X |
| 4,129,042 | 12/1978 | Rosvold ......................... | 73/727 |
| 4,141,253 | 2/1979 | Whitehead, Jr. ............... | 338/4 X |
| 4,168,630 | 9/1979 | Shirouzu et al. .............. | 338/42 X |
| 4,216,401 | 8/1980 | Wagner ......................... | 73/754 X |

FOREIGN PATENT DOCUMENTS 1246925 9/1971 United Kingdom ................. 73/754
1248087 9/1971 United Kingdom .

*Primary Examiner*—Arthur T. Grimley
*Assistant Examiner*—E. F. Borchelt
*Attorney, Agent, or Firm*—Schwartz, Jeffery, Schwaab, Mack, Blumenthal & Koch

[57] ABSTRACT

A pressure sensor of the type having a semiconductor diaphragm such as a silicon diaphragm which is formed with at least one diffused resistor in a surface region on one side thereof. A silicon block having the diaphragm is bonded to the inside of a box-like package such that the diffused resistor is exposed in a vacuum chamber defined in the package and that a fluid pressure can arrive at the back side of the diaphragm through a hole of the package. To minimize unwanted straining of the silicon diaphragm by thermal influences, the package is made of a material such as mullite whose linear expansion coefficient is close to that of silicon. To prevent an accidental change in the output characteristic of the sensor by the influence of an unintended external force, the package is supported above a base plate by pillar-like lead frames and confined in a space provided by fixing a cap to the base plate. A pressure introduction pipe is attached to either the base plate or the cap.

9 Claims, 9 Drawing Figures

PRESSURE SENSOR HAVING SEMICONDUCTOR DIAPHRAGM

BACKGROUND OF THE INVENTION

This invention relates to a pressure sensor whose sensitive element is a semiconductor diaphragm such as of silicon on which is formed a diffused resistor, and more particularly to an improvement in the construction of a pressure sensor of this type mainly with the view of improving the temperature characteristics and stability of performance against physical forces externally exerted on the sensor.

It is known to convert pressure signals into electrical signals by utilizing a piezoresistive effect of a semiconductor crystal. A conventional pressure sensor as a typical embodiment of this method has a silicon plate or block a portion of which takes the form of a diaphragm and a diffused resistor formed in a surface region of the silicon diaphragm. The silicon block is fixedly mounted on a base plate of an electrically insulating material and encased in a housing assembly such that the diffused resistor faces a vacuum chamber defined in the housing, while a fluid pressure subject to measurement can be applied onto the other side of the silicon diaphragm through a pipe attached to the housing and an aperture bored through the plate. The silicon block is bonded hermetically to the base plate which is bonded hermetically to an inner surface of the housing, so that the fluid pressure does not intrude into the vacuum chamber and, hence, does not arrive at the diffused resistor. When there is a difference between the pressures on the two sides of the silicon diaphragm, the resistance of the diffused resistor varies proportionally to the magnitude of the pressure difference or a resultant stress on the silicon diaphragm.

Compared with a more popular pressure sensor of the metal wire strain gauge type, the silicon diaphragm pressure sensor has an exceedingly high sensitivity and accordingly serves for precise measurement of pressure differentials even of very small magnitude. Since the diffusion resistor is always isolated from an external gas atmosphere, this pressure sensor is quite stable even when used in a chemically active gas atmosphere. Recently this pressure sensor has attracted attention in automobile industries as of use, for example, for accurate measurement of the magnitude of a negative pressure created in the intake system for the engine as a primary factor in a precise control of either air-to-fuel ratio or exhaust gas recirculation rate.

From a practical viewpoint, however, the above described silicon diaphragm pressure sensor is still unsatisfactory in its resistance to mechanical shocks and tolerance for rough handling. Since the silicon block is secured to the housing to which is fixed the pressure introduction pipe, the silicon diaphragm is liable to be distorted resulting in that a significant change occurs in the output characteristic of the sensor, when a mechanical force is exerted on the pressure introduction pipe as in the case of the sensor falling on a hard surface.

SUMMARY OF THE INVENTION

It is an object of the present invention to provide an improved pressure sensor of the type utilizing a semiconductor diaphragm having a diffused resistor formed in a surface region thereof, which sensor is excellent in its temperature characteristics and stableness in chemically active atmospheres and, besides, is not liable to exhibit an accidental change in its output characteristic by the influence of an external force unintendedly exerted on the sensor.

A pressure sensor according to the invention comprises a pressure-sensitive element having a block of a crystalline semiconductor a portion of which takes the form of a diaphragm and at least one diffused resistor formed in a surface region on a front side of the semiconductor diaphragm and a package to confine therein the pressure-sensitive element, which package is made up of at least two structural members integrated into a lidded box-like structure. The structural members are each made of an electrically nonconductive material whose coefficient of linear expansion is nearly equal to that of the crystalline semiconductor. The semiconductor block is confined in the interior of the package and bonded to the inside of the package such that the diaphragm is entirely spaced from the inside of the package and that a hermetically closed space is defined between the inside of the package and a front side of the block including the aforementioned front side of the diaphragm. The closed space is kept at a predetermined pressure so as to serve as a reference pressure chamber. One of the aforementioned structural members has a hole bored therethrough in such a position that a fluid pressure subject to measurement can be introduced into the interior of the package through the hole so as to arrive at the back side of the diaphragm.

Preferably, the semiconductor block is a silicon block, and mullite and zircon are preferred examples of electrically nonconductive materials close to silicon in linear expansion coefficient.

In a complete form, a pressure sensor according to the invention comprises (a) a probe assembly which includes the above stated package, the above stated pressure-sensitive element confined in the package and a plurality of lead frames which are metal members fixed to the package so as to each protrude from the outside of the package and electrically connected to the aforementioned at least one diffused resistor, (b) a base plate having a plurality of electrical terminals and (c) a cap fixed to the base plate such that a space is defined between the cap and the base plate. The lead frames are respectively fixed to the electrical terminals on the base plate such that the package is supported by the lead frames in a state confined in the space provided by the cap and entirely spaced from the base plate and the cap. Thus the lead frames serve not only as conductors but also as pillars for mechanically supporting the package containing the sensitive element in a state substantially isolated from the cap and the base plate, i.e. outer shell parts of the sensor. Either the base plate or the cap has a through hole opening into the space in the assembly of the cap and base plate, and (d) a pipe is fixed to the holed one of the base plate and the cap to introduce a fluid pressure subject to measurement into the space through this hole.

The silicon block of the sensitive element is bonded to the inside of the package preferably with a hermetic bonding layer which comprises a thin metal layer coated intimately on the inside of the package, a thin layer of gold plated on the metal layer and a thin layer of an eutectic alloy of gold with silicon formed at the interface between the silicon block and the gold plating layer.

DESCRIPTION OF THE PREFERRED EMBODIMENTS

Prior to the description of preferred embodiments of the present invention, a brief explanation of conventional pressure sensors of the type mentioned hereinbefore will be given with reference to FIGS. 8 and 9 in order to facilitate understanding of the features of the present invention.

Figure 8:
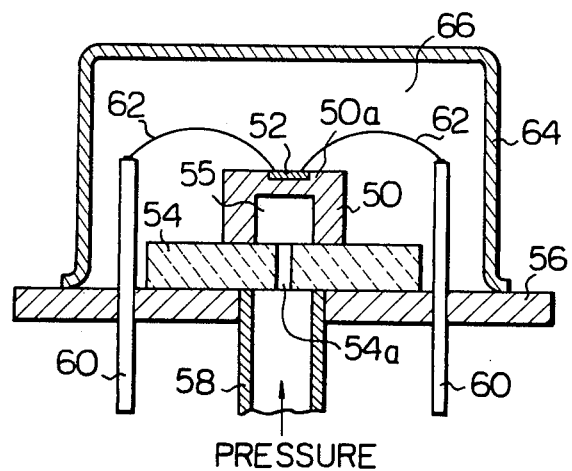
FIG. 8 is a perspective view of a conventional pressure sensor.

In FIG. 8, reference numeral 50 indicates a crystalline silicon block. A bottom side of the silicon block 50 is recessed so as to provide a diaphragm 50a in a central region on the top side of the block 50, and a diffused resistor (or diffused resistors) 52 is formed in an outer surface region of the silicon diaphragm 50a. This silicon block 50 is bonded hermetically to a base plate 54 of an electrically insulating inorganic material with the diaphragm 50a upside, so that a space 55 is defined between the base plate 54 and the diaphragm 50a. The base plate 54 has a through hole 54a opening into the space 55 and is placed on and bonded hermetically to a metal plate 56. The metal plate 56 has a through hole, and a pipe 58 is fitted into this hole and is fixed to the plate 56 so as to introduce a fluid pressure subject to measurement into the space 55 through the hole 54a. Two leads 60 are protruded through the metal plate 56 and bonded hermetically to the plate 56, and the diffused resistor 52 is electrically connected to these leads 60 by gold wires 62. A cup-shaped cap 64 is bonded hermetically to the metal plate 56 such that the base plate 54, silicon block 50 and the gold wires 62 are entirely enclosed in the cap 64 and spaced from the inside of the cap 64. A space 66 defined in the cap 64 is utilized as a reference pressure chamber such as a vacuum chamber.

As mentioned hereinbefore, the exertion of a thrusting force or a bending force on the pressure introduction pipe 58 of this pressure sensor is liable to cause distortion of the silicon diaphragm 50a and, hence, a significant change in the output characteristic of the sensor due to the integral assemblage of the silicon block 50, base plate 54, metal plate (a casing member) 56 and the pipe 58.

Figure 9:
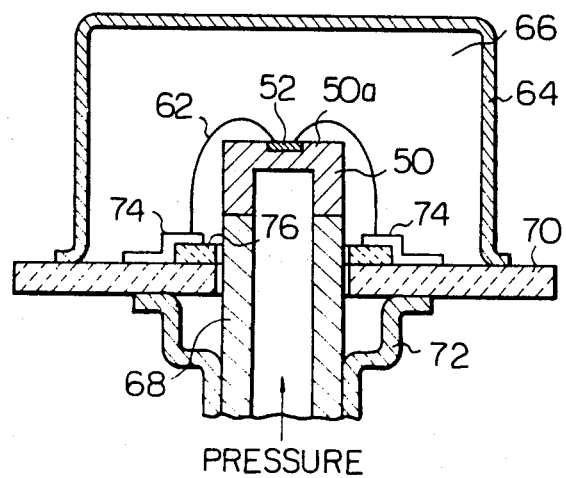
FIG. 9 is a perspective view of another conventional pressure sensor.

FIG. 9 shows a conventional pressure sensor similar in principle to the sensor of FIG. 8 but constructed somewhat differently. In the sensor of FIG. 9, the silicon block 50 is bonded to an end face of a ceramic pipe 68 so as to hermetically seal this end of the pipe 68. The housing of this sensor includes a base plate 70 of alumina, and the pipe 68 is made to pass through a hole of this plate 70 and secured to this plate 70 by means of a flanged metal pipe 72 which is bonded both to the outer surface of the ceramic pipe 68 and the outside of the base plate 70. The housing is completed by hermetically bonding cap 64 to the base plate 70 so as to define a vacuum chamber 66 therein.

The diffused resistor 52 is exposed to the vacuum chamber and electrically connected to leads or terminals 74, which are secured to the base plate 70, by gold wires 62. The sensor of FIG. 9 is functionally identical with the sensor of FIG. 8 and has the same drawback that the silicon diaphragm 50a is liable to be distorted or strained when an external force is exerted on the housing, particularly on the pipe 68.

Figure 1:
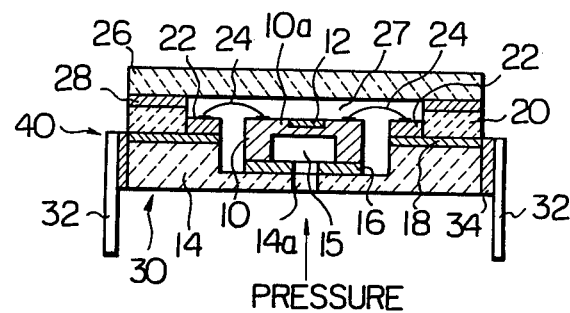
FIG. 1 is a sectional view of a principal portion of a pressure sensor according to the invention.

FIG. 1 shows a principal part of a pressure sensor as a preferred embodiment of the invention. Similarly to the above described conventional pressure sensors, this pressure sensor comprises a silicon diaphragm 10a as a top end region of a crystalline silicon block 10, and a diffused resistor (or diffued resistors) 12 is formed in a front surface region of the diaphragm 10a. This silicon block 10 is fixedly disposed in a package 30 which is fundamentally made up of a base 14, a frame 20 bonded to the base 14 so as to surround the silicon block 10 with a distance therebetween, a cap or lid 26 bonded to the frame 20 so as to define a space 27 in the package 30, electrode terminals 22 arranged on the base 14 and exposed to the space 27 and a plurality of conductors or lead frames 32 attached to the outer periphery of the base 14 and electrically connected with the electrode terminals 22. The silicon block 10 is positioned in the space 27 such that its front surface formed with the diffused resistor 12 faces the space 27 and is distant from the lid 26, and the diffused resistor 12 is electrically connected to the terminals 22 by gold wires 24. A small hole 14a is bored through the base 14 in such a position that a fluid pressure can be introduced through this hole 14a into a hollow 15 in the silicon block 10 but cannot enter the space 27 which is utilized as a reference pressure chamber and is usually evacuated. The lead frames 32 have a sufficient length and protrude from the plane of the bottom (outer) end face of the base 14, so that an assembly shown in FIG. 1 can be mounted on a separate base plate by utilizing the lead frames 32 as supporting pillars with the remaining parts of the package 30 spaced from the base plate.

In the pressure sensor according to the invention, the structural parts of the package 30, i.e. base 14, frame 20 and lid 26, are made of a material, preferably a ceramic material, whose coefficient of linear expansion is nearly equal to the linear expansion coefficient of silicon (about $4 \times 10^{-6}/°C$.) with a view to prevention of thermal straining of the silicon diaphragm 10a and a resultant change in the output characteristic of the sensor in the case of using the sensor at high and/or low temperatures. In the illustrated embodiment, the material for the package 30 is mullite whose linear expansion coefficient is $4.0 \sim 4.6 \times 10^{-6}/°C$.

In FIG. 1, reference numeral 16 indicates a hermetic bonding layer formed between the base 14 and the bottom end face of the silicon block 10 so as to surround the hole 14a, and indicated at 28 is a hermetic bonding layer intervening between the frame 20 and the lid 26.

The lead frames 32 are fixed to the base 14 by means of electrically conductive bonding layers 34 formed on the outer periphery of the base 14, and electrically conductive layers 18 are formed on the front surface of the base 14 so as to connect the terminals 22 to the outer conductive layers 34. To achieve reliable hermetic seal and to avoid thermal straining of the silicon block 10, the respective bonding layers in this assembly 40 are constituted in the following manners.

Figure 2:
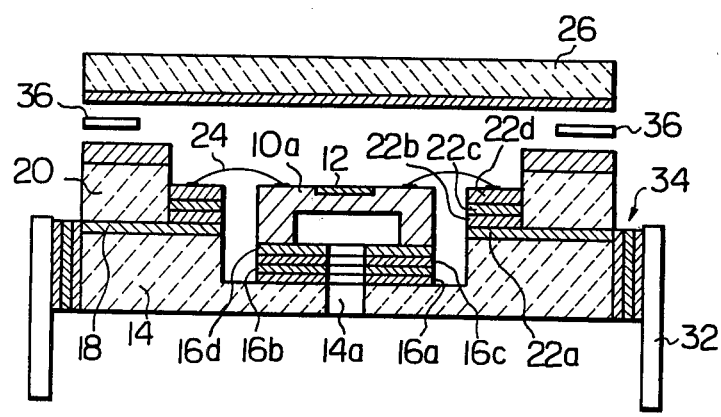
FIG. 2 shows the same portion of the same pressure sensor in the same sectional view but by an explanatory illustration to show the details of bonding layers in this sensor.

Referring to FIG. 2, the bonding of the silicon block 10 to the mullite base 14 is accomplished through the following procedures. First, the front end face of the base 14 is metallized either entirely or only in an area corresponding to the width of the silicon block 10 by coating with a very thin layer 16a (e.g. about 3~5 microns thick) of tungsten which is excellent in adhesion to ceramics. Next the tungsten layer 16a is coated with a thin (e.g. about 3~5 microns) layer 16b of nickel, which has the property of strongly adhering to either of tungsten and gold, by plating. Then the nickel layer 16b is plated with gold, which diffuses readily into silicon, so as to give a thin gold layer 16c, e.g. about 3~5 microns in thickness. The silicon block 10 is bonded to the gold layer 16c by melting the gold layer 16c, resulting in the formation of a thin Au-Si eutectic alloy layer 16d therebetween. It will be understood that, actually, the total thickness of this bonding layer 16 is only about 10~15 microns, so that thermal expansion of this layer 16 has little influence on the silicon diaphragm 10a. The nickel layer 16b prevents permeation of melted gold into the tungsten layer 16a.

Each of the conductive layers 18 is a thin tungsten layer which is analogous to the tungsten layer 16a and plated with nickel and gold. Each of the electrode terminals 22 consists of a thin tungsten layer 22a, a thin nickel coating 22b formed by plating, a thin gold layer 22c formed by plating and a terminal lug 22d of gold-plated nickel soldered onto the gold layer 22c. The conductive layers 34 on the outside are formed generally similarly to the electrode terminals 22.

Figure 3:
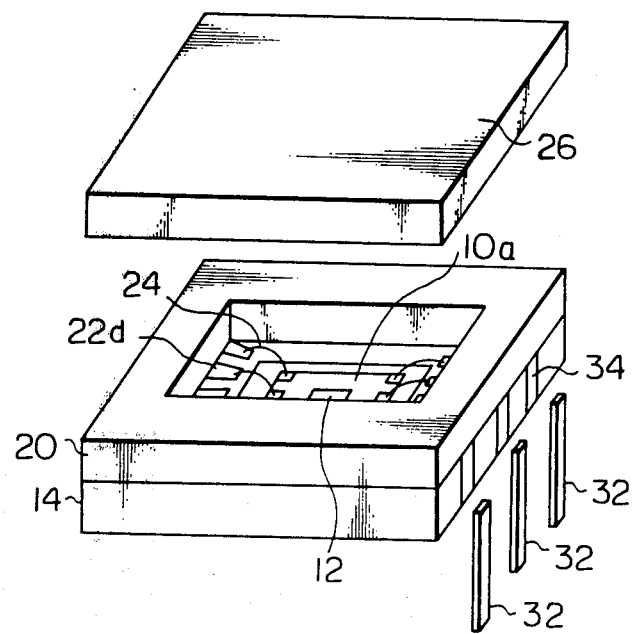
FIG. 3 is a perspective and partially exploded view of the same portion of the pressure sensor of FIG. 1.

The hermetic bonding layer 28 between the frame 20 and the lid 26 is formed by the use of a suitable soldering material 36 which may be a glass composition or a Au-Sn eutectic alloy. In advance, the upper end face of the frame 20 and the inner surface of the lid 26 may be metallized and plated. For example, this bonding procedure is performed in an evacuated heating chamber to achieve the solder-bonding and provision of the vacuum chamber 27 simultaneously. Thereafter the lead frames 32 are solder-bonded to the semifinished package 30 containing therein the silicon block 10. FIG. 3 illustrates these procedures, and FIG. 4 shows the appearance of the completed assembly 40 of FIG. 1.

The material of the package 30 is not limited to mullite which is used in this embodiment. Examples of other materials having an appropriate linear expansion coefficient and a sufficient rigidity are zircon whose linear expansion coefficient is $3.7 \sim 4.3 \times 10^{-6}/°C$. and Pyrex (trademark of Corning Glass) glass whose linear expansion coefficient is about $3 \sim 3.6 \times 10^{-6}/°C$. It is preferable that all the structural parts of the package 30 are made of the same material.

Figure 4:
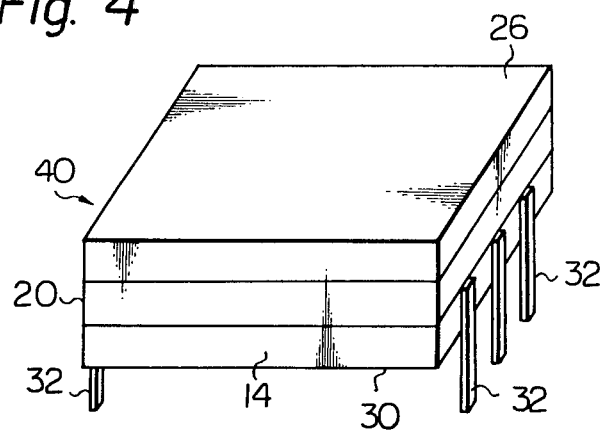
FIG. 4 is a perspective view of the same portion of the same pressure sensor.
Figure 5:
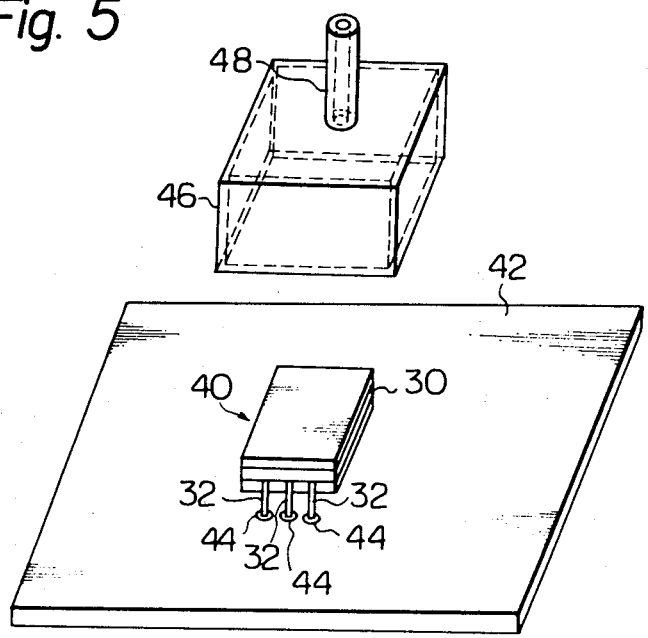
FIG. 5 illustrates a final stage of an assembly process to fabricate a pressure sensor according to the invention.
Figure 6:
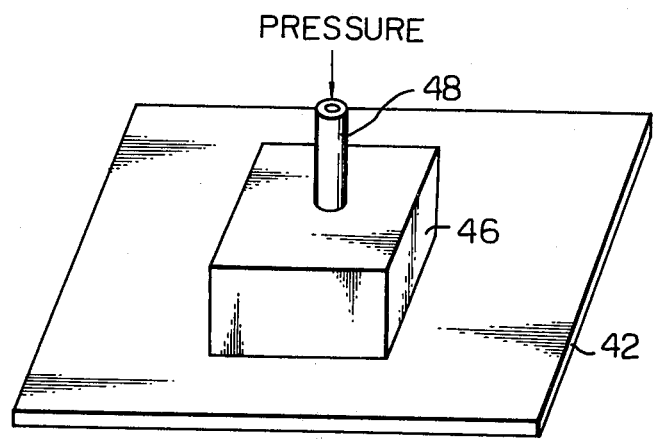
FIG. 6 is a perspective view of a pressure sensor fabricared through the procedure of FIG. 5.

Referring to FIGS. 5 and 6, a pressure sensor according to the invention is completed by mounting the assembly 40 of FIGS. 1 and 4 on a base plate 42, utilizing the lead frames 32 as support pillars, and securing a cap 46 to the base plate 42 so as to enclose the assembly 40 therein. In this embodiment, this cap 46 has a hole and a pipe 48 is fixed to the cap 46 so as to introduce a fluid pressure subject to measurement into the interior of the assembled sensor. The base plate 42 is of an electrically insulating material such as alumina, and an electrical circuit (omitted from illustration) to take out electrical signals from the packaged probe assembly 40 of the sensor, or a more complicated circuit including a signal processing function, is formed on this base plate 42. The lead frames 32 of the assembled package 30 are respectively connected, both electrically and mechanically, to terminals 44 correspondingly arranged in the circuit on the base plate 42 such that the assembed package 30, i.e. the packaged probe assembly 40, is held by the lead frames 32 at a distance above the base plate 42. Then the cap 46 is fixed to the base plate 42, for example, by means of a bonding agent. There is no particular limitation to the material of the cap 46 and the attached pipe 48, so that a suitable material may be selected from metals, ceramics and synthetic resins. The dimensions of the cap 46 are such that the package 30 is entirely spaced from the inner surfaces of the cap 46.

The pressure-sensing function of the sensor of FIG. 6 is similar to that of the sensor of FIG. 8 or 9. A fluid pressure subject to measurement is admitted into the interior of the cap 46 through the pipe 48 and then into the packaged probe assembly 40 through the hole 14a to arrive at the back side of the silicon diaphragm 10a. Then the diffused resistor 12 exhibits a change in its resistance proportionally to the magnitude of this fluid pressure.

Since the diffused resistor 12 faces the hermetically sealed vacuum chamber 27, there is no possibility that the diffused resistor 12 is chemically influenced by any gas introduced into the packaged probe assembly 40. Accordingly this pressure sensor has excellent durability and can be used even in a chemically active gas atmosphere such as an oxidizing atmosphere. Owing to the closeness of the linear expansion coefficient of the material of the package 30, particularly of the base 14, to that of silicon and the bonding of the silicon block 10 to the metallized surface of the base 14 with the formation of a thin Au-Si eutectic alloy at the interface, this pressure sensor is excellent also in its temperature characteristic, that is, the temperature dependence of the output of this sensor is linear and very slight over a wide temperature range. Accordingly, it is easy to practically nullify changes in the output with changes in the temperature by the use of a simple compensation circuit. Moreover, the output characteristic of this pressure sensor is scarcely susceptible to mechanical forces externally exerted on the sensor. Since the packaged probe portion 40 including the silicon diaphragm 10a is supported by the lead frames 32 and separated or isolated both from the base plate 42 and from the cap 46 and, consequently, also from the pipe 48, even when a great force such as a shock upon collision of the sensor against a rigid body or fall of the sensor on a hard surface is exerted on the sensor to result in some deformation of the pipe 48, cap 46 or base 42 the silicon block 10 is not influenced by such an external force. Therefore, there is little possibility of the silicon diaphragm 10a being strained by the influence of an external force, meaning that this pressure sensor is not likely to exhibit an accidental change in its output characteristic and features an exceedingly good stability of its function.

Figure 7:
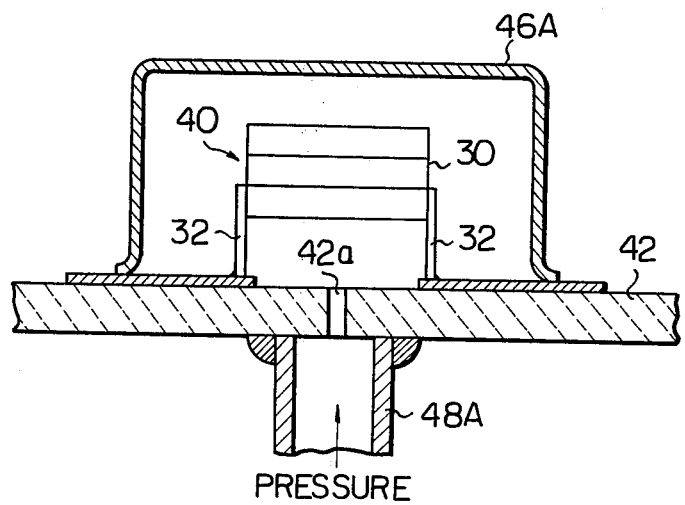
FIG. 7 is a sectional view of a pressure sensor as another embodiment of the invention.

FIG. 7 shows a modification of the pressure sensor of FIG. 6. The probe assembly 40 including the package 30 is not modified. In this case, a cap 46A having no gas inlet is fixed to the base plate 42 so as to enclose therein the packaged probe assembly 40, and a pipe 48A is attached to the back side of the base plate 42 so as to admit a fluid pressure subject to measurement into the interior of the cap 46A through a hole 42a bored through the base plate 42. It will be apparent that the pressure sensor of FIG. 7 functions identically with the sensor of FIG. 6 and has the same advantages.

What is claimed is:

1. A pressure sensor comprising:
(a) a probe assembly comprising
 (i) a pressure-sensitive element comprising a block of a crystalline semiconductor a portion of which takes the form of a diaphragm having front and back sides and at least one diffused resistor formed in a surface region on said front side of said diaphragm;
 (ii) a package made up of at least two structural members integrated into a lidded box-like structure, said structural members being each made of an electrically nonconductive material whose coefficient of linear expansion is nearly equal to the coefficient of linear expansion of said crystalline semiconductor, said block of said pressure-sensitive element being confined in the interior of said package and bonded to one of said at least two structural members such that said diaphragm is entirely spaced apart from the inside of said package and that a hermetically closed first space is defined between the inside of said package and said front side of said diaphragm, said space being kept at a predetermined pressure so as to serve as a reference pressure chamber, said one of said at least two structural members further including a first hole bored therethrough in such a position that a fluid pressure subject to measurement can be admitted into the interior of said package through said hole so as to arrive at said back side of said diaphragm; and
 (iii) a plurality of lead frames which are elongate metal members fixed to said package so as to each protrude from the outside of said package and electrically connected to said at least one diffused resistor said lead frames comprising means for supporting the weight of said package;
(b) a base plate having a plurality of electrical terminals, said lead frames being respectively fixed to said base plate at said electrical terminals such that said package is supported by said lead frames in a state entirely spaced from said base plate;
(c) a cap fixed to said base plate such that a second space is defined between said cap and said base plate and that said probe assembly is entirely confined in said second space and spaced from the inside of said cap, one of said cap and said base plate having a second hole bored therethrough so as to open into said second space; and
(d) a pipe fixed to said one of said cap and said base plate such that the interior of said pipe communicates with said second space only through said second hole to introduce said fluid pressure into said second space.

2. A pressure sensor according to claim 1, wherein said crystalline semiconductor is crystalline silicon.

3. A pressure sensor according to claim 2, wherein said at least two structural members are each made of a material selected from the group consisting of mullite and zircon.

4. A pressure sensor according to claim 3, wherein said block is bonded to the inside of said package with a bonding layer comprising a thin metal layer intimately coated on the inside of said package at least in a selected area, a thin layer of gold plated on said metal layer and a thin layer of an eutectic alloy of gold with silicon formed at the interface between said block and said layer of gold.

5. A pressure sensor according to claim 4, wherein said metal layer is a combination of a thin layer of tungsten in direct contact with the inside of said package and a thin layer of nickel coated on said layer of tungsten.

6. A pressure sensor according to claim 1, wherein said package further comprises a plurality of electrical terminals fixed to the inside of said package and electrically connected respectively to said lead frames, said at least one diffused resistor being electrically connected to said terminals in said package by a plurality of metal wires extending in said first space.

7. A pressure sensor according to claim 1, wherein said at least two structural members are each fixed to an adjacent one with a hermetic bonding layer.

8. A pressure sensor according to claim 7, wherein said first space is evacuated.

9. A pressure sensor according to claim 4 or 7, wherein said package is an integration of a platy base which has said first hole, a frame which is a platy member having an opening in a central region thereof and bonded to said base such that said first hole communicates with said opening and a cap member bonded to said frame, said opening being larger in cross-sectional area than said block, said block of said pressure-sensitive element being bonded to said base so as to constitute a barrier to the communication of said first hole with at least a major volume of said opening.

* * * * *